US010680121B2

(12) United States Patent
Huang et al.

(10) Patent No.: US 10,680,121 B2
(45) Date of Patent: Jun. 9, 2020

(54) OPTICAL FINGERPRINT SENSOR AND MANUFACTURING METHOD OF SENSING MODULE THEREOF

(71) Applicant: Egis Technology Inc., Taipei (TW)

(72) Inventors: Yu-Hsiang Huang, Taipei (TW); Tong-Long Fu, Taipei (TW); Chen-Chih Fan, Taipei (TW)

(73) Assignee: EGIS TECHNOLOGY INC., Taipei (TW)

( * ) Notice: Subject to any disclaimer, the term of this patent is extended or adjusted under 35 U.S.C. 154(b) by 0 days.

(21) Appl. No.: 16/007,857

(22) Filed: Jun. 13, 2018

(65) Prior Publication Data

US 2018/0366593 A1    Dec. 20, 2018

Related U.S. Application Data (60) Provisional application No. 62/519,879, filed on Jun. 15, 2017, provisional application No. 62/621,192, filed on Jan. 24, 2018.

(51) Int. Cl.
*H01L 31/02* (2006.01)
*H01L 31/0216* (2014.01)
(Continued)

(52) U.S. Cl.
CPC ...... *H01L 31/02164* (2013.01); *G06K 9/0004* (2013.01); *H01L 27/14623* (2013.01);
(Continued)

(58) Field of Classification Search
CPC ... H01L 51/52; H01L 51/528; H01L 51/5284; H01L 31/02; H01L 31/021;
(Continued)

(56) References Cited

U.S. PATENT DOCUMENTS 5,325,442 A    6/1994 Knapp
5,446,290 A    8/1995 Fujieda et al.
(Continued)

FOREIGN PATENT DOCUMENTS

CN    102073860 A    5/2011
TW    M553003 U    12/2017
(Continued)

OTHER PUBLICATIONS

Japan Patent Office, Office Action, Patent Application Serial No. 2018-114536, dated Sep. 3, 2019, Japan.

*Primary Examiner* — Monica D Harrison (57) ABSTRACT

An optical fingerprint sensor is provided. The optical fingerprint sensor includes a sensing module. The sensing module includes a light sensing layer and a light filter layer disposed above the light sensing layer. The light sensing layer includes a plurality of photo detectors arranged in a sensing array. The light filter layer includes a plurality of collimators. The collimators are divided into a plurality of collimator groups corresponding to the photo detectors, and the number of collimator groups is equal to the number of photo detectors. Each of the collimator groups comprises the same number of collimators arranged in a specific pattern and disposed above the corresponding photo detector. The photo detectors receive reflected light from a user's finger through the collimators of the corresponding collimator groups.

17 Claims, 8 Drawing Sheets

(51) Int. Cl.
*H01L 27/32* (2006.01)
*H01L 31/0232* (2014.01)
*G06K 9/00* (2006.01)
*H01L 27/146* (2006.01)
*H01L 31/167* (2006.01)
*H01L 51/52* (2006.01)

(52) U.S. Cl.
CPC .. *H01L 27/14643* (2013.01); *H01L 27/14685* (2013.01); *H01L 27/3227* (2013.01); *H01L 27/3234* (2013.01); *H01L 31/02327* (2013.01); *H01L 31/167* (2013.01); *H01L 51/5284* (2013.01)

(58) Field of Classification Search
CPC .......... H01L 31/0261; H01L 31/02614; H01L 31/023; H01L 31/0232; H01L 31/02327; H01L 31/16; H01L 31/167; H01L 27/14; H01L 27/146; H01L 27/1462; H01L 27/1464; H01L 27/1468; H01L 27/14623; H01L 27/14643; H01L 27/14685; H01L 27/32; H01L 27/322; H01L 27/323; H01L 27/3234; H01L 27/3227
USPC ...................................................... 257/81, 88
See application file for complete search history.

(56) References Cited

U.S. PATENT DOCUMENTS

| | | |
|---|---|---|
| 5,726,443 A | 3/1998 | Immega et al. |
| 7,683,640 B2 | 3/2010 | Chuang et al. |
| 7,709,775 B2 | 5/2010 | Konno et al. |
| 8,433,110 B2 | 4/2013 | Kropp et al. |
| 2002/0180585 A1 | 12/2002 | Kim et al. |
| 2004/0252867 A1 | 12/2004 | Lan et al. |
| 2007/0109438 A1 | 5/2007 | Duparre et al. |
| 2010/0177060 A1 | 7/2010 | Han |
| 2013/0314377 A1 | 11/2013 | Los |
| 2016/0132712 A1* | 5/2016 | Yang .................... G06K 9/0002 348/77 |
| 2016/0224816 A1 | 8/2016 | Smith et al. |
| 2016/0254312 A1 | 9/2016 | Lee et al. |
| 2017/0017824 A1 | 1/2017 | Smith et al. |
| 2017/0156651 A1 | 6/2017 | Arias et al. |
| 2017/0220840 A1 | 8/2017 | Wickboldt et al. |
| 2017/0220844 A1 | 8/2017 | Jones et al. |
| 2017/0270342 A1 | 9/2017 | He et al. |

FOREIGN PATENT DOCUMENTS

| | | |
|---|---|---|
| WO | WO 2017/062506 A1 | 4/2017 |
| WO | WO 2017206676 A1 | 12/2017 |

* cited by examiner

OPTICAL FINGERPRINT SENSOR AND MANUFACTURING METHOD OF SENSING MODULE THEREOF

CROSS REFERENCE TO RELATED APPLICATIONS

This application claims the benefit of U.S. Provisional Application No. 62/519,879, filed on Jun. 15, 2017, and U.S. Provisional Application No. 62/621,192, filed on Jan. 24, 2018, the entirety of which are incorporated by reference herein.

BACKGROUND OF THE INVENTION

Field of the Invention

The invention relates to an optical fingerprint sensor, and more particularly to an optical fingerprint sensor with a specific collimator pattern.

Description of the Related Art

In recent years, biological identification technology has become increasingly mature, and different biological features can be used for identifying users. Since the recognition rate and accuracy of fingerprint identification technology are better than those of other biological feature identification technologies, fingerprint identification and verification is used extensively in various applications.

Fingerprint identification and verification technology detects a user's fingerprint image, captures fingerprint data (for example, feature points) from the fingerprint image, and stores the fingerprint data to the memory as a template, or directly stores the fingerprint image. Thereafter, during verification, the user presses or swipes a finger on or over the fingerprint sensor so that a fingerprint image can be sensed and fingerprint data thereof captured. Then, the fingerprint data is compared with the template. If the two match, then the user's identity is verified.

Figure 1:
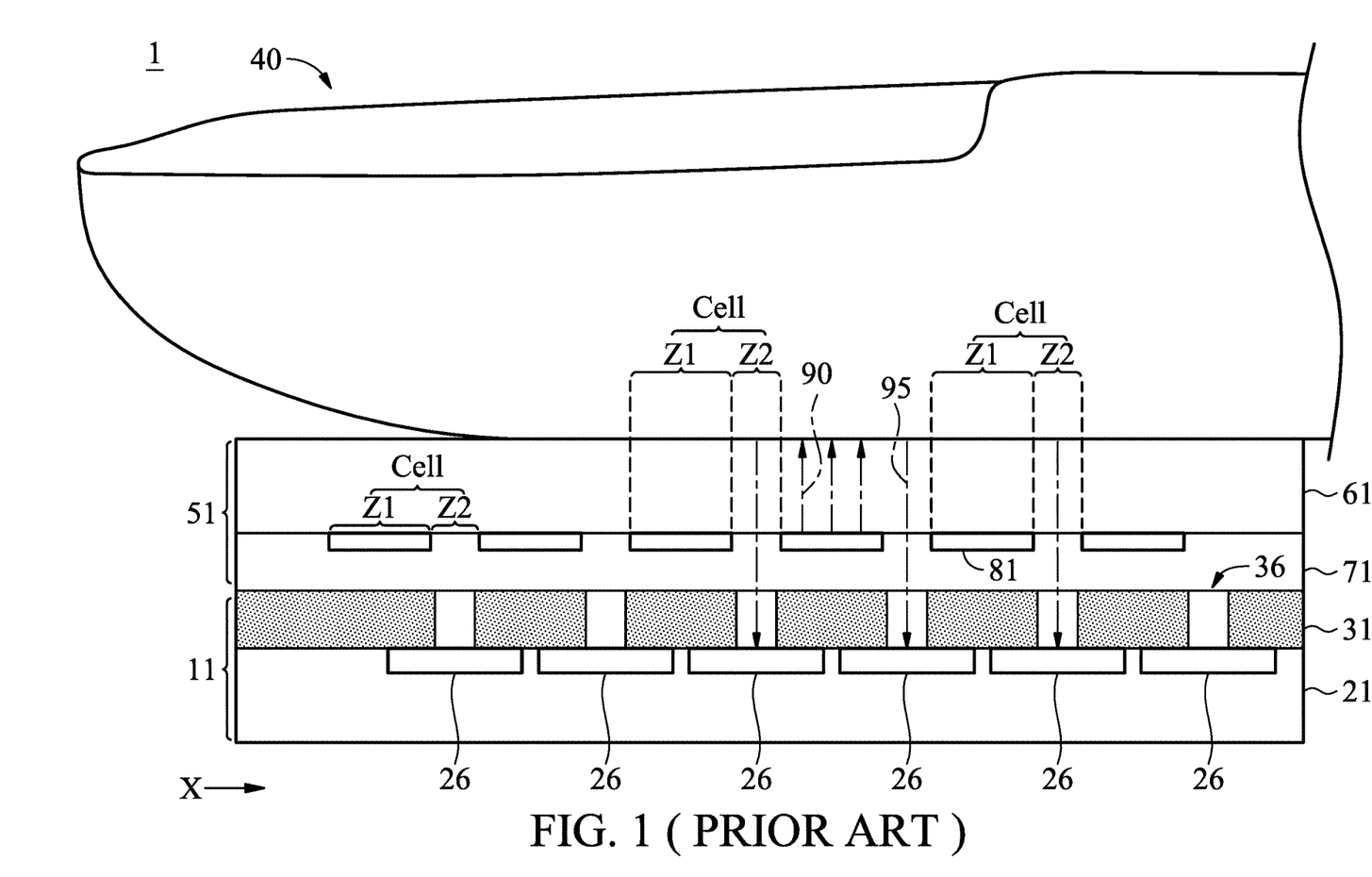
FIG. 1 shows a conventional optical fingerprint sensor.

FIG. 1 shows a conventional optical fingerprint sensor 1. In a conventional optical fingerprint sensor 1, the light-emitting units Cell of the panel module 51, the photo detectors 26 of the sensing module 11 and the collimators 36 are equal in number. Each photo detector 26 is corresponding to a single collimator 36, and receives the light through the single corresponding collimator 36. The collimators 36 are respectively aligned with the transparent zones Z2 of the light-emitting units Cell in the panel module 51 so as to prevent the collimators 36 from being partially or entirely covered by the non-transparent zones Z1 of the light-emitting units Cell. Otherwise, light may not pass through the collimators and then reach the photo detectors 26 below the collimators 36. Thus, in the manufacturing process of a conventional optical fingerprint sensor 1, when the sensing module 11 is being attached to the panel module 51, the photo detectors 26 of the sensing module 11 have to be respectively aligned with the transparent zones Z2 of the light-emitting units Cell of the panel module 51. When the sensing module 11 is being fabricated, the photo detectors 26 also have to be respectively aligned with the collimators 36 so as to prevent the collimators 36 from being partially or entirely covered by the non-transparent zones Z1 of the panel module 51. Accordingly, the reflected light may pass through the collimators, and the photo detectors 26 may receive the light emitted by the light-emitting units Cell and reflected by the user's finger.

BRIEF SUMMARY OF THE INVENTION

Optical fingerprint sensors and manufacturing methods of a sensing module thereof are provided. An embodiment of an optical fingerprint sensor is provided. The optical fingerprint sensor includes a sensing module. The sensing module includes a light sensing layer and a light filter layer disposed above the light sensing layer. The light sensing layer includes a plurality of photo detectors arranged in a sensing array. The light filter layer includes a plurality of collimators. The collimators are divided into a plurality of collimator groups corresponding to the photo detectors, and the number of the collimator groups is equal to the number of photo detectors. In each of the collimator groups, the collimators form a specific pattern and are disposed above the corresponding photo detector. Each of the photo detectors receives reflected light from the user's finger through the collimators of the corresponding collimator group.

Furthermore, an embodiment of a manufacturing method of a sensing module for an optical fingerprint sensor is provided. A plurality of photo detectors are formed in a light sensing layer, and the photo detectors are arranged in a sensing array. A plurality of collimators are formed in a light filter layer, and the collimators are divided into a plurality of collimator groups corresponding to the photo detectors. The collimator groups are arranged in a collimator group array. The light sensing layer is attached to the light filter layer so that the light filter layer is disposed on the light sensing layer and the collimator group array of the light filter layer is aligned with the sensing array of the light sensing layer. Each of the collimator groups corresponds to one of the photo detectors, and aligned with and disposed above the corresponding photo detector. Each of the collimator groups comprises the same number of collimators arranged in a specific pattern.

Moreover, another embodiment of an optical fingerprint sensor is provided. The optical fingerprint sensor includes a sensing module. The sensing module includes a light sensing layer and a light filter layer disposed above the light sensing layer. The light sensing layer includes a plurality of photo detectors arranged in a sensing array. The light filter layer includes a plurality of collimators. The collimators are divided into a plurality of first collimator groups with a first pattern and a plurality of second collimator groups with a second pattern. The total number of first and second collimator groups is equal to the number of photo detectors. The first and second collimator groups are arranged in a collimator group array, and aligned with the photo detectors in the sensing array. The photo detectors receive reflected light from the user's finger through the collimators of the corresponding first or second collimator groups.

Furthermore, another embodiment of a manufacturing method of a sensing module for an optical fingerprint sensor is provided. A plurality of photo detectors are formed in a light sensing layer, and the photo detectors are arranged in a sensing array. A plurality of collimators are formed in a light filter layer, and the collimators are divided into a plurality of first collimator groups with a first pattern and a plurality of second collimator groups with a second pattern. The first and second collimator groups are arranged in a collimator group array. The light sensing layer is attached to the light filter layer so that the light filter layer is disposed above the light sensing layer and the collimator group array of the light filter layer is aligned with the sensing array of the light sensing layer. Each of the first and second collimator groups corresponds to one of the photo detectors, and is aligned with and disposed above the corresponding photo detector. The total number of the first and second collimator groups is equal to the number of photo detectors.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
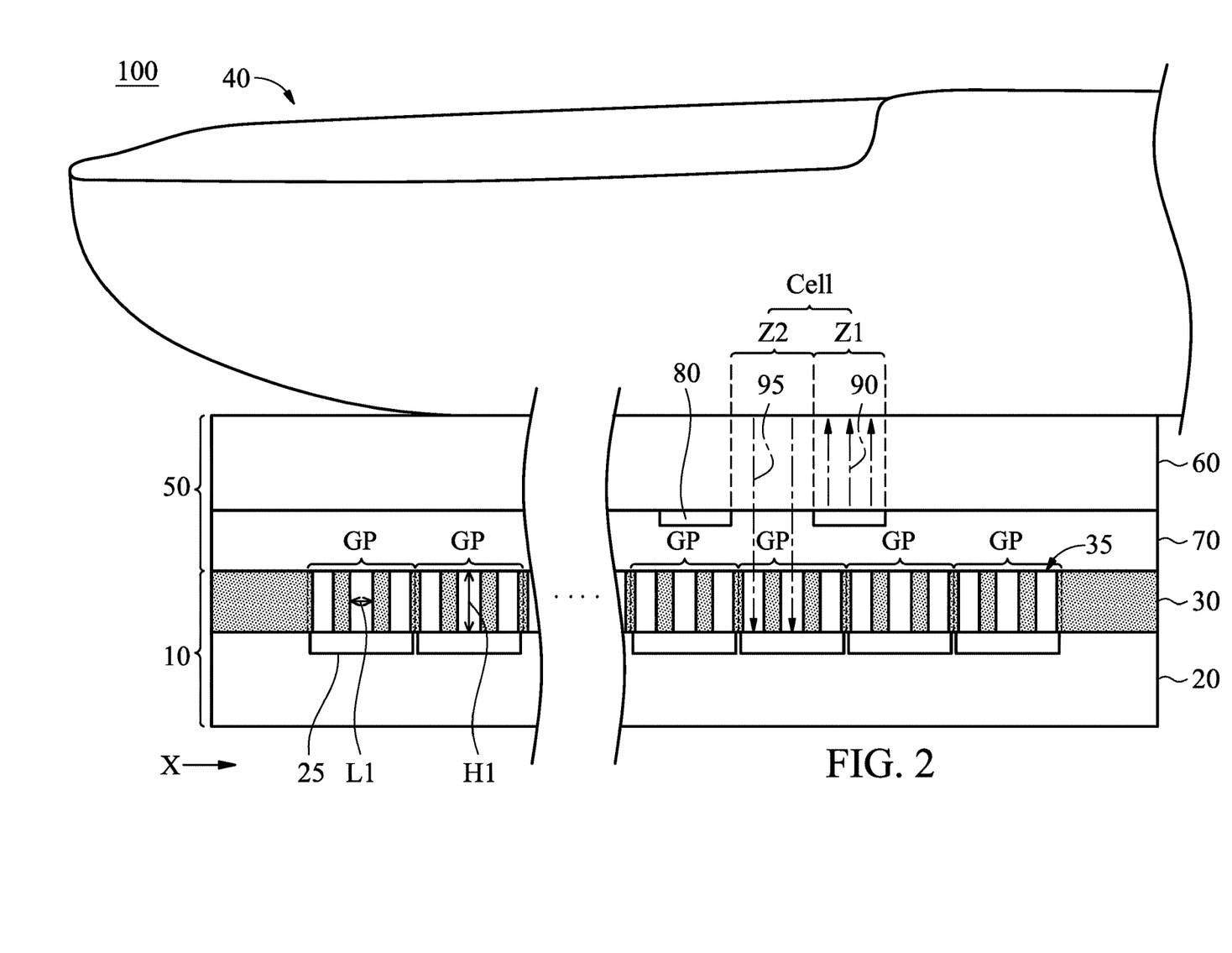
FIG. 2 shows an optical fingerprint sensor according to an embodiment of the invention.

FIG. 2 shows an optical fingerprint sensor 100 according to an embodiment of the invention. The optical fingerprint sensor 100 includes a sensing module 10 and a panel module 50. The sensing module 10 is disposed under the panel module 50. The optical fingerprint sensor 100 is manufactured by attaching the sensing module 10 to the panel module 50. In the embodiment, the sensing module 10 is attached to the panel module 50 via an adhesive (not shown).

The panel module 50 includes a cover glass 60 and a light-emitting layer 70. The light-emitting layer 70 includes a light-emitting array including a plurality of light-emitting units Cell. In order to simplify the description, the configuration of the light-emitting units Cell in the light-emitting layer 70 will be omitted. The cover glass 60 is disposed above the light-emitting layer 70 so as to cover the light-emitting array. Each light-emitting unit Cell has a light source zone (i.e. a non-transparent zone) Z1 and a transparent zone Z2, and the light source zone Z1 includes a light-emitting device 80. The light-emitting device 80 emits the light 90, and the light 90 will penetrate the cover glass 60 to illuminate the finger 40. In some embodiments, the panel module 50 is an organic light-emitting diode (OLED) panel, and the light-emitting device 80 is an organic light-emitting diode (OLED). In some embodiments, the panel module 50 is a micro-LED panel, and the light-emitting device 80 is a micro-LED.

The sensing module 10 includes a light sensing layer (or light receiving layer) 20 and a light filter layer 30. The light filter layer 30 of the sensing module 10 may be attached to the light-emitting layer 70 of the panel module 50 via an adhesive. The light sensing layer 20 includes a plurality of photo detectors 25 arranged in a sensing array. In one embodiment, the photo detectors 25 are photo diodes. In an X direction, each photo detector 25 has the same length. Furthermore, the light detectors 25 are spaced evenly.

The light filter layer 30 is made of light blocking (e.g., light-shielding, light-absorbing or opaque) materials. The light filter layer 30 has a plurality of collimators 35. Light (e.g., the reflected light 95) passes through the collimators 35 of the light filter layer 30 to reach the light sensing layer 20 disposed under the light filter layer 30. In some embodiments, each collimator 35 forms an opening in the light filter layer 30, so that the light can pass from one side to the other side of the light filter layer 30 through the collimators. Moreover, each collimator 35 has the same shape and size of opening (e.g., an diameter L1). In some embodiments, the diameter L1 of the collimators 35 is between 1 and 20 micrometers (μm). In addition, the ratio of the diameter L1 to a height H1 of the collimators 35 is between 1:3 and 1:30.

In the light filter layer 30, the collimators 35 are divided into a plurality of collimator groups GP. The collimator groups GP are respectively aligned with the photo detectors 25, each of the collimator groups GP is corresponding to one of the photo detectors 25, and each collimator group GP has the same number of collimators 35. Compared to the conventional optical fingerprint sensors, in the optical fingerprint sensor 100 of FIG. 2 of the present invention, the total number of the collimators 35 is greater than that of the photo detectors 25, and one of the photo detectors 25 can receive the reflected light passing through several collimators 35 within the corresponding collimator group GP. Therefore, when manufacturing the sensing module 10, the collimators 35 need not to be aligned with the photo detectors 25 while the collimator groups GP have to be respectively aligned with the photo detectors 25. Furthermore, when the panel module 50 is being attached to the sensing module 10, the photo detectors 25 of the sensing module 10 need not to be aligned with the light-emitting units Cell of the panel module 50. Therefore, in the present invention, the manufacturing process of the optical fingerprint sensor 100 is simplified and the yield is increased.

In FIG. 2, when the finger 40 contacts the optical fingerprint sensor 100, the light-emitting devices 80 in the light source zones Z1 of the light-emitting units Cell emit the light 90, and the light 90 penetrates the cover glass 60 to illuminate the finger 40. The reflected light 95 reflected from the surface of the finger 40 passes through the collimators 35 of the light filter layer 30 of the sensing module 10, to reach the light sensing layer 20. The photo detectors 25 of the light sensing layer 20 will sense the reflected light 95. The reflected light 95 reflected by the fingerprint ridges and the fingerprint valleys of the finger 40 will have different amounts of energy or wavelengths. After receiving the reflected light 95, each photo detector 25 converts the received reflected light 95 into a sensing output, and provides the sensing output to a processor (not shown) or other subsequent circuits, so as to obtain fingerprint information of the finger 40.

The number of photo detectors 25 of the light sensing layer 20 may be an integer multiple of the number of light-emitting units Cell of the light-emitting layer 70. In some embodiments, some photo detectors 25 may be partially covered by the light source zones Z1 of the light-emitting units Cell, and such photo detectors 25 may receive the reflected light 95 emitted by the two adjacent light-emitting units Cell disposed above them and reflected from the finger 40. Since each photo detector 25 is disposed under the multiple collimators 35 in the corresponding collimator group GP, when some of the collimators 35 disposed above the photo detector 25 are covered by the light source zones Z1 of the light-emitting units Cell disposed above the photo detector 25, the photo detector 25 can receive the reflected light 95 through the other collimators 35 of the collimator group GP that are not entirely covered by the light source zones Z1. Thus, according to the sensing output provided by each photo detector 25, the optical fingerprint sensor 100 can obtain the fingerprint information of the finger 40.

Figure 3:
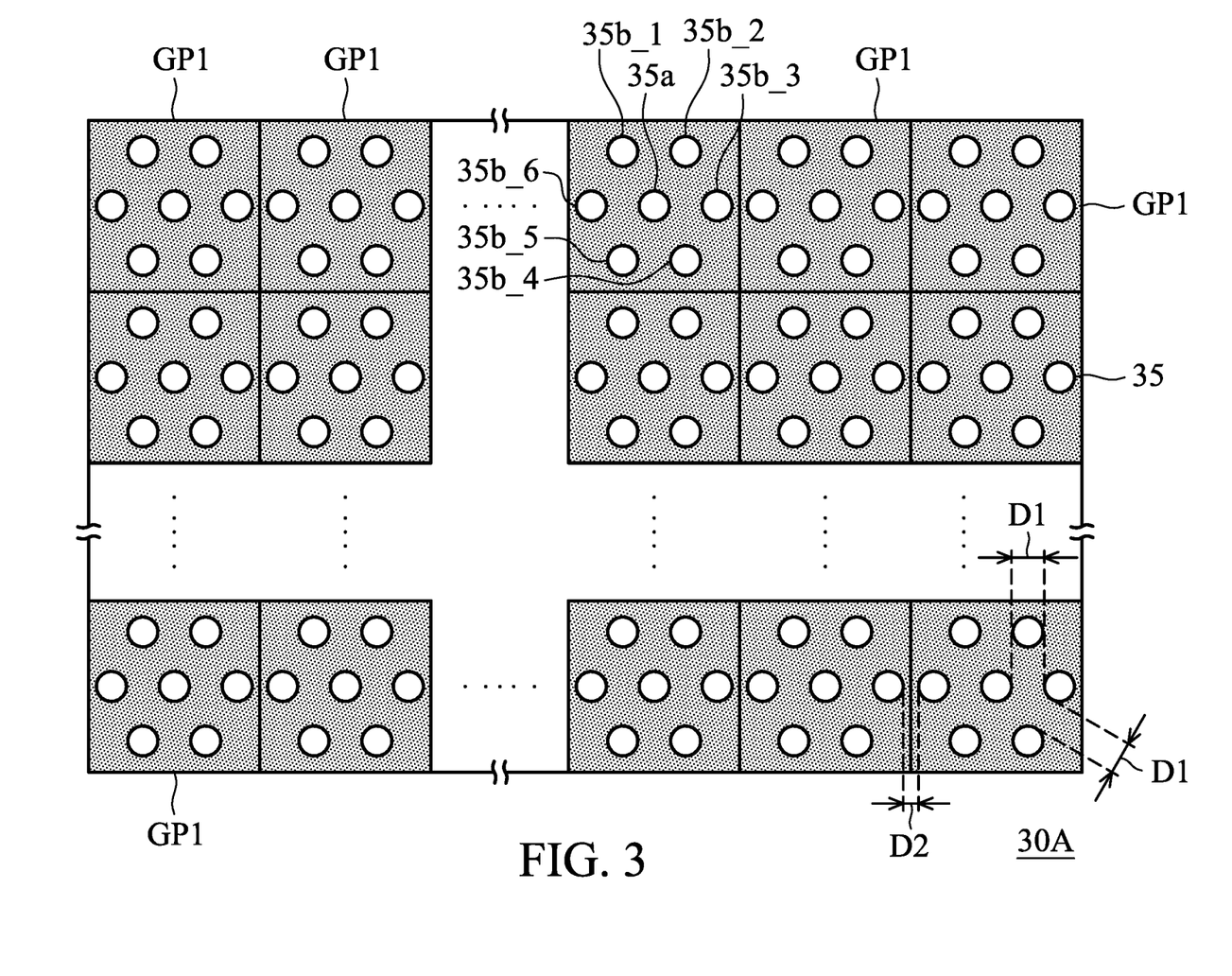
FIG. 3 shows a top view of a light filter layer according to an embodiment of the invention.

FIG. 3 shows a top view of a light filter layer 30A according to an embodiment of the invention. In the light filter layer 30A, a plurality of collimators 35 are divided into a plurality of collimator groups GP1. The collimator groups GP1 are arranged in a collimator group array, and the photo detectors 25 are arranged in a sensing array. The collimator groups GP1 of the collimator group array are respectively aligned with the photo detectors 25 of the sensing array, and each of the collimator groups GP1 is corresponding to one of the photo detectors 25 of the light sensing layer 20 of FIG. 2. In other words, each collimator group GP1 is disposed above the corresponding photo detector 25. In FIG. 3, each collimator group GP1 comprises seven collimators 35 arranged in a specific pattern. In the embodiment, the specific pattern includes a single center collimator 35a arranged in the center of the specific pattern and a plurality of peripheral collimators 35b_1-35b_6 surrounding the single center collimator 35a. In the embodiment, the number of the peripheral collimator 35b_1-35b_6 is 6, and the arrangement of the peripheral collimator 35b_1-35b_6 forms a hexagon. In some embodiments, the distance D1 between two adjacent collimators 35 in each collimator group GP1 is identical. That is, the collimators 35 in each collimator group GP1 are spaced evenly, and the distance D1 from the center collimator 35a to each of the peripheral collimators 35b_1-35b_6 is identical (i.e., the peripheral collimators 35b_1-35b_6 are equidistant from the center collimator 35a), and the distance D1 between any two adjacent ones of the collimators 35b_1-35b_6 is also identical. In some embodiments, the distance D1 is greater than or equal to 3 micrometers (μm). Moreover, the distance D2 between the two peripheral adjacent collimators 35 separately located at two adjacent collimator groups GP1 is smaller than the distance D1 between the two adjacent collimators 35 located at the same collimator group GP1, i.e. D2<D1. In some embodiments, the diameter (i.e. L1 in FIG. 2) of the collimators 35 is greater than the distance D1 between the two adjacent collimators 35.

Figure 4:
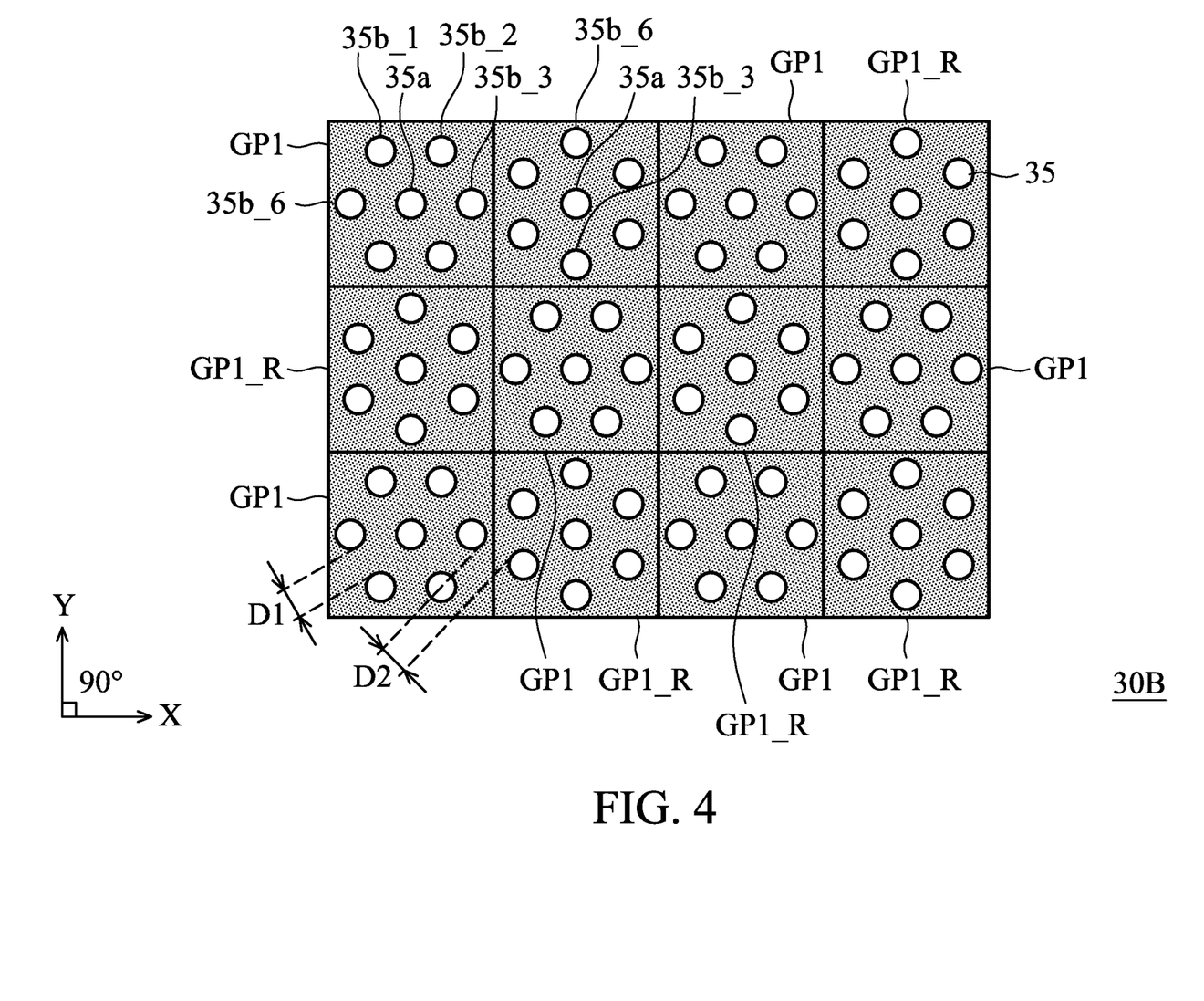
FIG. 4 shows a top view of a light filter layer according to another embodiment of the invention.

FIG. 4 shows a top view of a light filter layer 30B according to another embodiment of the invention. In the light filter layer 30B, a plurality of collimator 35 are divided into a plurality of collimator groups GP1 and a plurality of collimator groups GP1_R. The collimator groups GP1 and GP1_R are arranged in a collimator group array, and the photo detectors 25 are arranged in a sensing array. The collimator groups GP1 and GP1_R of the collimator group array are respectively aligned with the photo detectors 25 of the sensing array, and each of the collimator groups GP1 and GP1_R is corresponding to one of the photo detectors 25 of the light sensing layer 20 of FIG. 2. In other words, each collimator group GP1 or GP1_R is disposed above the corresponding photo detector 25. In addition, in each row and each column of the collimator group array, the collimator groups GP1 and the collimator groups GP1_R are alternately arranged. Thus, each collimator group GP1 is adjacent to four of the collimator groups GP1_R on the four sides, and similarly, each collimator group GP1_R are adjacent to four of the collimator groups GP1 on the four sides. In the embodiment, a second specific pattern of the collimator groups GP1_R can be obtained by clockwise rotating a first specific pattern of the collimator groups GP1 by 90 degrees. For example, in each collimator group GP1, the peripheral collimator 35b_6, the center collimator 35a and the peripheral collimator 35b_3 are disposed on the same straight line along the X direction. In each collimator group GP1_R, the peripheral collimator 35b_3, the center collimator 35a and the peripheral collimator 35b_6 are disposed on the same straight line along the Y direction. Moreover, the distance D1 between two adjacent collimators 35 in each collimator group GP1_R and each collimator group GP1 is identical. In some embodiments, the distance D1 is greater than or equal to 3 micrometers (μm). It should be noted that the distance D2 of the two adjacent peripheral collimators 35 separately located at two adjacent collimator groups GP1 and GP1_R is greater than or equal to the distance D1 between the two adjacent collimators 35 located at the same collimator group GP1 or GP1_R, i.e., D2≥D1. In some embodiments, the diameter of the collimator 35 (i.e. L1 in FIG. 2) is greater than the distances D1 and D2.

Figure 5:
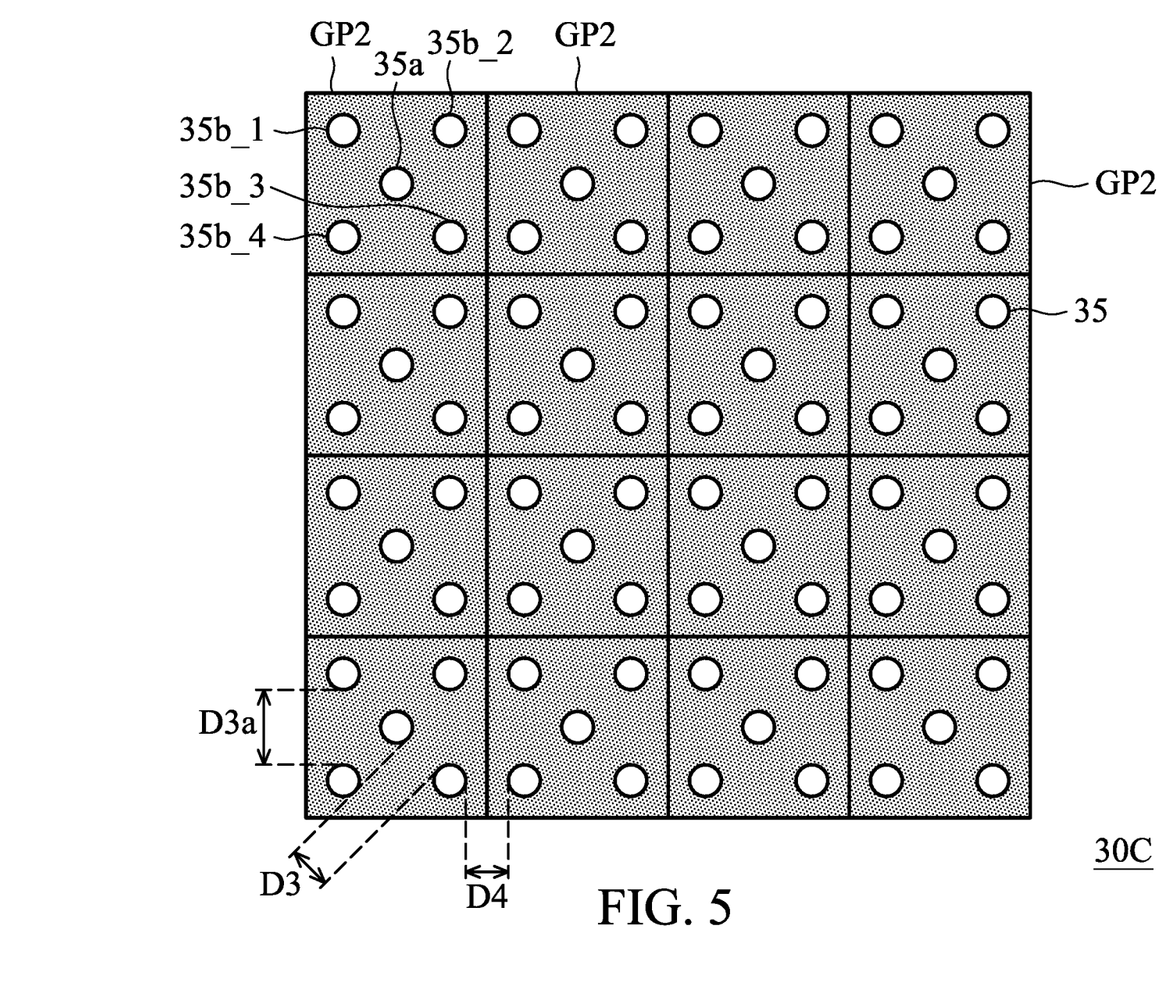
FIG. 5 shows a top view of a light filter layer according to another embodiment of the invention.

FIG. 5 shows a top view of a light filter layer 30C according to another embodiment of the invention. In the light filter layer 30C, a plurality of collimators 35 are divided into a plurality of collimator groups GP2. In addition, the collimator groups GP2 are arranged in a collimator group array, and the photo detectors 25 are arranged in a sensing array. The collimator groups GP2 of the collimator group array are respectively aligned with the photo detectors 25 of the sensing array, and each of the collimator groups GP2 is corresponding to one of the photo detectors 25 of the light sensing layer 20 of FIG. 2. In other words, each collimator group GP2 is disposed above the corresponding photo detector 25. In FIG. 5, each collimator group GP2 includes five collimators 35 arranged in a specific pattern. Moreover, a single center collimator 35a is arranged at the center of the specific pattern and is surrounded by a plurality of peripheral collimators 35b_1-35b_4. In the embodiment, the number of the peripheral collimators 35b_1-35b_4 is 4, and the peripheral collimators 35b_1-35b_4 are arranged to form a quadrilateral. In each collimator group GP2, the distance D3 from the center collimator 35a to each of the peripheral collimators 35b_1-35b_4 is identical (i.e. the peripheral collimators 35b_1-35b_4 are equidistant from the center collimator 35a), and the distance D3a between two adjacent ones of the peripheral collimators 35b_1-35b_4 is also identical, where D3a≥D3. In some embodiments, the distance D3 is greater than or equal to 3 micrometers (μm). In some embodiments, the distance D4 between the two adjacent peripheral collimators 35 separately located at two adjacent collimator groups GP2, is greater than or equal to the distance D3 between the two adjacent collimators 35 located at the same collimator group GP2, i.e. D4≥D3. In some embodiments, the diameter (i.e. L1 in FIG. 2) of the collimator 35 is greater than the distances D3 and D4.

Figure 6:
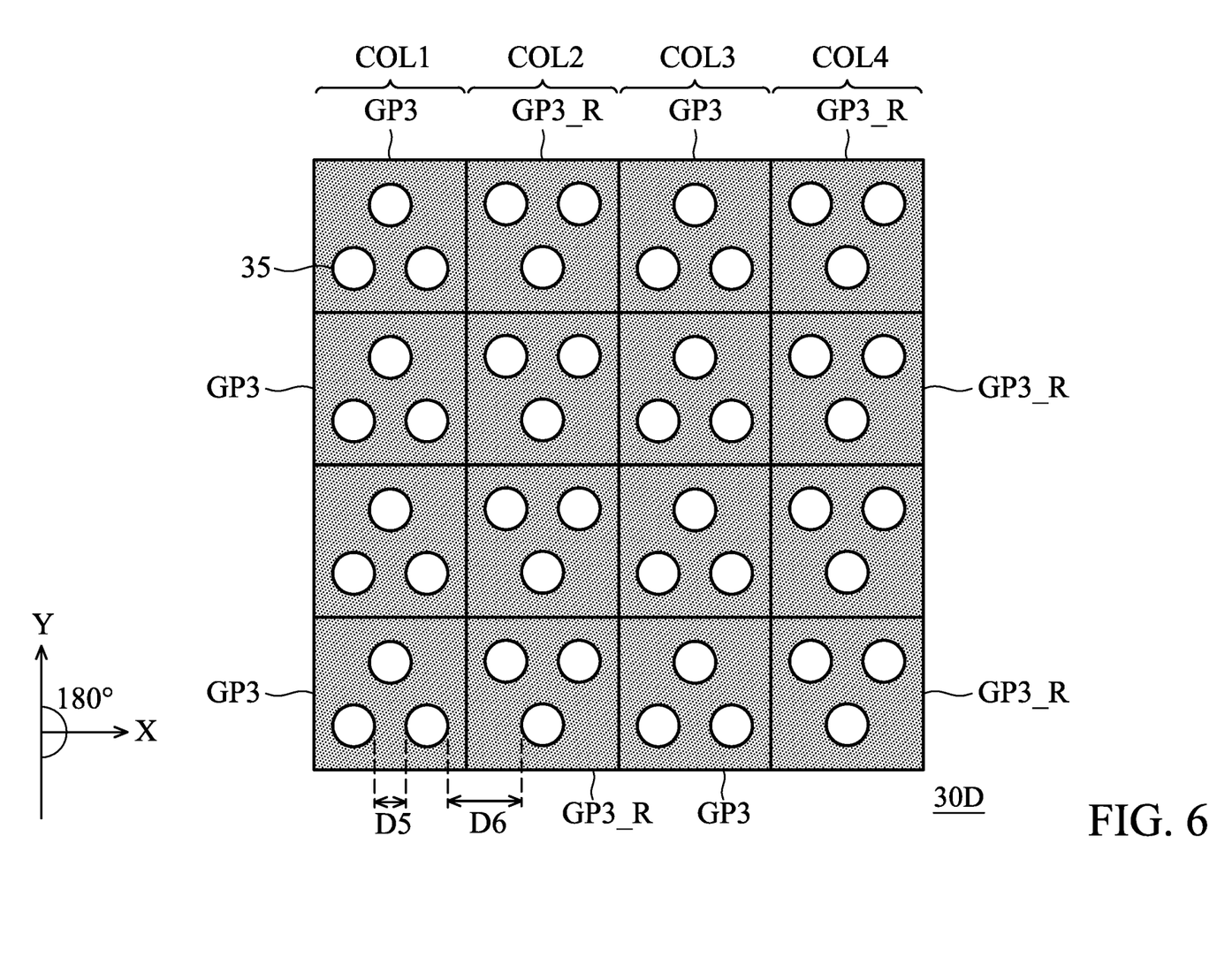
FIG. 6 shows a top view of a light filter layer according to another embodiment of the invention.

FIG. 6 shows a top view of the light filter layer 30D according to another embodiment of the invention. In the light filter layer 30D, a plurality of collimators 35 are divided into a plurality of collimator groups GP3 and a plurality of collimator groups GP3_R. The collimator groups GP3 and GP3_R are arranged in a collimator group array, and the photo detectors 25 are arranged in a sensing array. The collimator groups GP3 and GP3_R of the collimator group array are respectively aligned with the photo detectors 25 of the sensing array, and each of the collimator groups GP3 and GP3_R is corresponding to one of the photo detectors 25 of the light sensing layer 20 of FIG. 2. Each of the collimator groups GP3 and GP3_R is disposed above the corresponding photo detector 25. In addition, in each row of the collimator group array, the collimator groups GP1 and the collimator groups GP1_R are arranged alternately, and in each column of the collimator group array, the same collimator groups GP3 or GP3_R are arranged. For example, the collimator groups GP3 are arranged in the first column COL1 and the third column COL3. The collimator groups GP3_R are arranged in the second column COL2 and the fourth column COL4. In the embodiment, a first specific pattern of the collimator groups GP3 is a triangle formed by three collimators 35. In the embodiment, the first specific pattern in the collimator groups GP3 does not have a center collimator. In addition, a second specific pattern of the collimator groups GP3_R is obtained by rotating the first specific pattern of the collimator groups GP3 by 180 degrees. Furthermore, the distance D5 between any two adjacent ones of the collimators 35 in each collimator group GP3 and each collimator group GP3_R is identical. In some embodiments, the distance D5 is greater than or equal to 3 micrometers (μm). In the embodiment, the distance D6 between the two adjacent collimators 35 separately located at two adjacent collimator groups GP3 and/or GP3_R, is greater than or equal to the distance D5 between two adjacent collimators 35 in the same collimator group GP3 or GP3_R, i.e. D6≥D5. In some embodiments, in each column of the collimator group array, the collimator groups GP3 and GP3_R are arranged alternately, and in each row of the collimator group array, the same collimator groups GP3 or GP3_R are arranged. In some embodiments, the diameter (i.e. L1 in FIG. 2) of the collimators 35 is greater than the distances D5 and D6.

Figure 7:
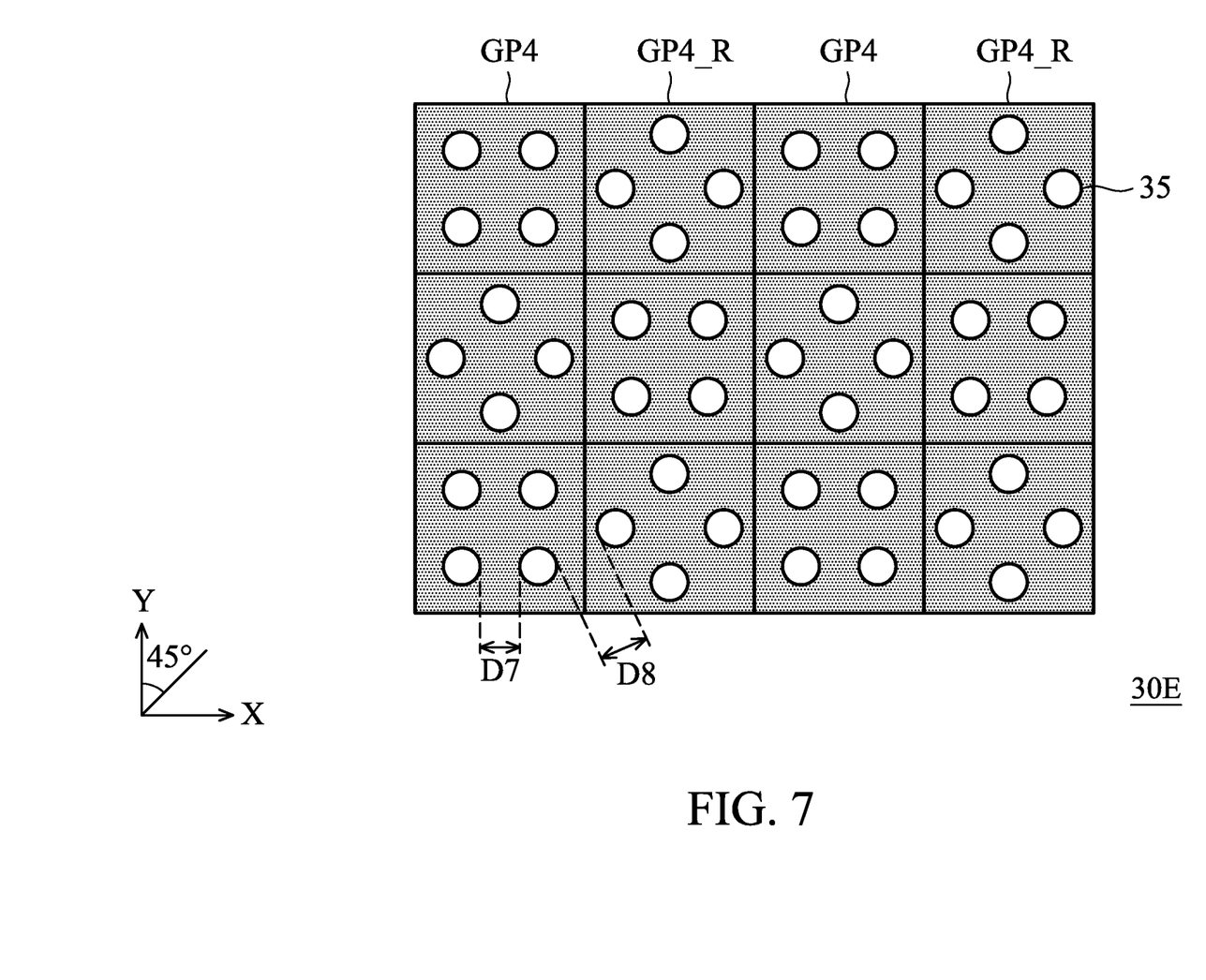
FIG. 7 shows a top view of a light filter layer according to another embodiment of the invention.

FIG. 7 shows a top view of a light filter layer 30E according to another embodiment of the invention. In the light filter layer 30E, a plurality of collimators 35 are divided into a plurality of collimator groups GP4 and a plurality of collimator groups GP4_R. The collimator groups GP4 and GP4_R are arranged in a collimator group array, and the photo detectors 25 are arranged in a sensing array. The collimator groups GP4 and GP4_R of the collimator group array are respectively aligned with the photo detectors 25 of the sensing array, and each of the collimator groups GP4 and GP4_R is corresponding to one of the photo detectors 25 of the light sensing layer 20 of FIG. 2. Each of the collimator groups GP4 and GP4_R is disposed above the corresponding photo detector 25. Moreover, in each row and each column of the collimator group array, the collimator groups GP4 and the collimator groups GP4_R are alternately arranged. Thus, each collimator group GP4 is adjacent to four of the collimator groups GP4_R on the four sides, and each collimator group GP4_R is adjacent to four of the collimator groups GP4 on the four sides. Each collimator group GP4 comprises four collimators 35 arranged in a first specific pattern of quadrilateral. In the embodiment, the first specific pattern of the collimator groups GP4 does not have a center collimator. In addition, a second specific pattern of the collimator groups GP4_R is obtained by clockwise rotating the first specific pattern of the collimator groups GP4 by 45 degrees. Furthermore, the distance D7 between two adjacent collimators 35 in each of the collimator groups GP4 and each of the collimator groups GP4_R is identical. In some embodiments, the distance D7 is greater than or equal to 3 micrometers (μm). In FIG. 7, the distance D8 between the two adjacent collimators 35 separately located at two adjacent collimator groups GP4 and GP4_R may be equal to or greater than the distance D7 between the two adjacent collimators 35 located at the same collimator group GP4 or GP4_R, i.e. D8≥D7. In some embodiments, the diameter (i.e. L1 in FIG. 2) of the collimators 35 is greater than the distances D7 and D8.

Figure 8:
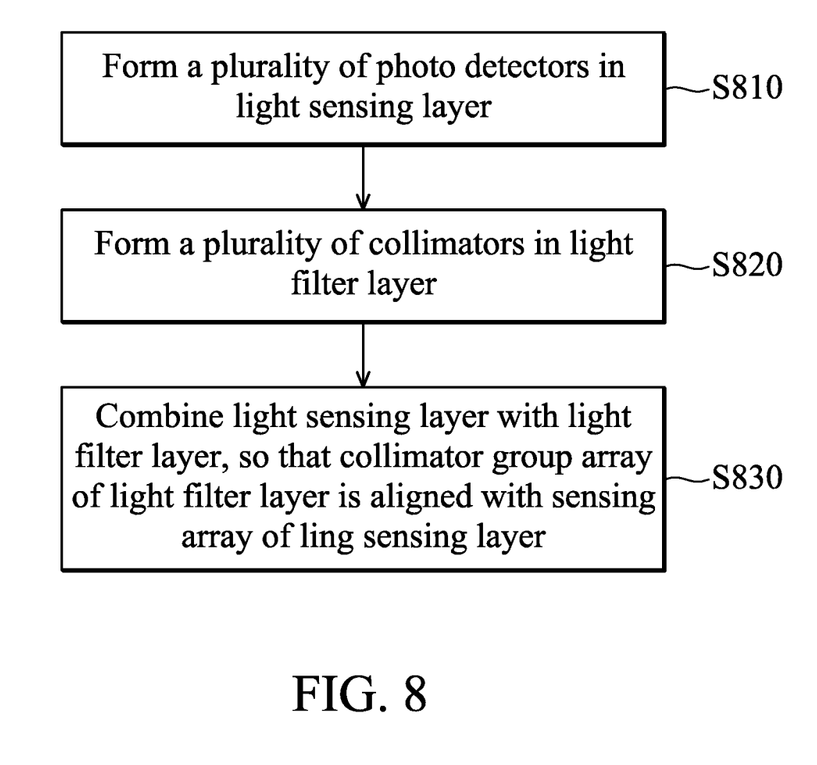
FIG. 8 shows a manufacturing method of the sensing module of the optical fingerprint sensor according to an embodiment of the invention.

FIG. 8 shows a manufacturing method of the sensing module 10 of the optical fingerprint sensor 100 according to an embodiment of the invention. First, in step S810, a plurality of photo detectors 25 are formed in the light sensing layer 20, and the photo detectors 25 are arranged as a sensing array. Next, in step S820, a plurality of collimators 35 are formed in the light filter layer 30. In some embodiments, the collimators 35 of the light filter layer 30 may be divided into a plurality of collimator groups with the same pattern, such as the collimator groups GP1 of the light filter layer 30A in FIG. 3 and the collimator groups GP2 of the light filter layer 30C in FIG. 5. The collimator groups in the light filter layer 30 are arranged in a collimator group array. In some embodiments, the collimators 35 of the light filter layer 30 may be divided into a plurality of first collimator groups with a first pattern and a plurality of second collimator groups with a second pattern, such as the collimator groups GP1 and GP1_R of the light filter layer 30B in FIG. 4, the collimator groups GP3 and GP3_R of the light filter layer 30D in FIG. 6 and the collimator groups GP4 and GP4_R of the light filter layer 30E in FIG. 7. The first and second collimator groups in the light filter layer 30 are arranged in a collimator group array. In some embodiments, the number of the photo detectors 25 in the sense array is the same as the number of the collimator groups in the collimator group array. In some embodiments, the order of steps S810 and S820 may be reversed.

In some embodiments, in step S820, the second collimator groups with the second pattern is obtained by rotating the first collimator groups with the first pattern. In addition, in step S820, the first collimator groups and the second collimator groups are alternately arranged in each row and/or each column of the collimator group array.

Next, in step S830, the light sensing layer 20 is attached to the light filter layer 30 in such a way that the light filter layer 30 is positioned above the light sensing layer 20, and the collimator group array of the light filter layer 30 is aligned with the sensing array of the light sensing layer 20. In other words, each photo detector 25 of the sensing array corresponds to one of the collimator groups in the collimator group array, and is aligned with the corresponding collimator group.

In the optical fingerprint sensors of the embodiments of the invention, each photo detector corresponds to a plurality of collimators in the corresponding collimator group, and therefore, in the process of manufacturing the sensing module, the photo detectors are respectively aligned with the corresponding collimator groups without considering the positional relationship between the photo detectors and the individual collimators. Furthermore, when attaching the sensing module to the panel module, neither does it need to the positional relationship between the sensing module and the panel module since the photo detectors need not to be aligned with the light-emitting units. Therefore, the manufacturing process of the optical fingerprint sensor will be simplified and the yield can be improved.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An optical fingerprint sensor, comprising:
a sensing module, comprising:
a light sensing layer comprising a plurality of photo detectors arranged in a sensing array; and
a light filter layer disposed above the light sensing layer and comprising a plurality of collimators;
wherein the collimators are divided into a plurality of collimator groups corresponding to the photo detectors, and the number of the collimator groups is equal to the number of the photo detectors;
wherein in each of the collimator groups, the collimators form a specific pattern and are disposed above the corresponding photo detector;
wherein each of the photo detectors receives reflected light from a user's finger through the collimators of the corresponding collimator group,
wherein the specific patterns of two adjacent ones of the collimator groups are different.

2. The optical fingerprint sensor as claimed in claim 1, wherein in each of the collimator groups, a distance between any two adjacent ones of the collimators is identical.

3. The optical fingerprint sensor as claimed in claim 1, wherein the collimator groups have the same number of collimators.

4. The optical fingerprint sensor as claimed in claim 1, wherein each of the collimator groups comprises a center collimator and a plurality of peripheral collimators surrounding the center collimator.

5. The optical fingerprint sensor as claimed in claim 4, wherein the peripheral collimators are equidistant from the center collimator.

6. The optical fingerprint sensor as claimed in claim 1, wherein a first distance between two adjacent ones of the collimators separately located at two adjacent ones of the collimator groups is equal to a second distance between two adjacent ones of the collimators located at the same one of the collimator groups.

7. The optical fingerprint sensor as claimed in claim 1, wherein a first distance between two adjacent ones of the collimators separately located at two adjacent ones of the collimator groups is different from a second distance between two adjacent ones of the collimators located at the same one of the collimator groups.

8. The optical fingerprint sensor as claimed in claim 1, further comprising:
a panel module, comprising:
a cover glass; and
a light-emitting layer disposed under the cover glass and between the cover glass and the light filter layer of the sensing module, providing light to illuminate the user's finger placed on the cover glass,
wherein the reflected light from the user's finger reaches the photo detectors through the collimators of the corresponding collimator groups.

9. The optical fingerprint sensor as claimed in claim 1, wherein the ratio of a diameter to height of the collimators is between 1:3 and 1:30 and the diameter of the collimators is between 1 and 20 micrometers.

10. An optical fingerprint sensor, comprising:
a sensing module, comprising:
a light sensing layer comprising a plurality of photo detectors arranged in a sensing array; and
a light filter layer disposed above the light sensing layer and comprising a plurality of collimators;
wherein the collimators are divided into a plurality of first collimator groups with a first pattern and a plurality of second collimator groups with a second pattern that is different from the first pattern;
wherein the first and second collimator groups are arranged in a collimator group array and respectively aligned with the photo detectors, and the total number of the first and second collimator groups is equal to the number of the photo detectors;
wherein each of the photo detectors is corresponding to one of the first or second collimator groups and receives reflected light from a user's finger through the collimators of the corresponding first or second collimator group.

11. The optical fingerprint sensor as claimed in claim 10, wherein in each of the first or second collimator groups, a distance between any two adjacent ones of the collimators is identical.

12. The optical fingerprint sensor as claimed in claim 10, wherein the second pattern is obtained by rotating the first pattern by a specific angle.

13. The optical fingerprint sensor as claimed in claim 12, wherein each of the first or second collimator groups comprises a center collimator and a plurality of peripheral collimators surrounding the center collimator.

14. The optical fingerprint sensor as claimed in claim 13, wherein the peripheral collimators are equidistant from the center collimator.

15. The optical fingerprint sensor as claimed in claim 10, wherein in each row or each column of the collimator group array, the first collimator groups and the second collimator groups are alternately arranged.

16. The optical fingerprint sensor as claimed in claim 10, further comprising:
a panel module, comprising:
a cover glass; and
a light-emitting layer disposed under the cover glass and between the cover glass and the light filter layer of the sensing module, providing light to illuminate the user's finger placed on the cover glass;
wherein the reflected light from the user's finger reaches the photo detectors through the collimators of the corresponding first or second collimator groups.

17. The optical fingerprint sensor as claimed in claim 10, wherein the ratio of a diameter to height of the collimators is between 1:3 and 1:30 and the diameter of the collimators is between 1 and 20 micrometers.

* * * * *